United States Patent [19]

Kawakami et al.

[11] Patent Number: 4,754,229
[45] Date of Patent: Jun. 28, 1988

[54] MATCHING CIRCUIT FOR A MICROWAVE DEVICE

[75] Inventors: Toshimasa Kawakami; Katsuya Kudo, both of Fukaya, Japan

[73] Assignee: Kabushiki Kaisha Toshiba, Kawasaki, Japan

[21] Appl. No.: 947,999

[22] Filed: Dec. 31, 1986

[30] Foreign Application Priority Data

Jan. 8, 1986 [JP] Japan ................ 61-826[U]

[51] Int. Cl.⁴ .................. H03F 3/16; H03F 7/38
[52] U.S. Cl. .................... 330/277; 330/286; 333/32; 333/33; 455/317; 455/327
[58] Field of Search ............ 333/32, 33, 204, 205; 330/277, 286; 455/285, 302, 317, 327

[56] References Cited

U.S. PATENT DOCUMENTS 4,352,076 9/1982 Saitoh et al. ................ 333/204
4,460,879 7/1984 Hirose ...................... 333/205 X
4,658,220 4/1987 Heston et al. ............... 330/277

FOREIGN PATENT DOCUMENTS 68870 1/1983 European Pat. Off. ........... 455/327
65613 6/1978 Japan ......................... 333/33
53-27067 8/1978 Japan.
59-43001 10/1984 Japan.

OTHER PUBLICATIONS

Tserng et al., *Design, Fabrication, and Characterization of Monolithic, Microwave GaAs Power FET Amplifiers,* IEEE Trans. on E.D., 2/81, pp. 183–190.
The New Frontier, 13–cm GaAs FET Preamp, QST, Aug. 1984, p. 65.

*Primary Examiner*—Paul Gensler
*Attorney, Agent, or Firm*—Cushman, Darby & Cushman

[57] ABSTRACT

A microwave matching circuit, having a main line (for transmitting a high frequency signal) and a stub, formed close to the main line (for matching the input terminal of the high-frequency signal and the output terminal of the main line) includes a capacitor, for absorbing unnecessary components at the main line and other output terminals, connected between the main line and the stub.

5 Claims, 6 Drawing Sheets

MATCHING CIRCUIT FOR A MICROWAVE DEVICE

BACKGROUND OF THE INVENTION

The present invention relates to a matching circuit of a microwave device and, more particularly, to a circuit having improved microwave characteristics.

As is conventionally known, a semiconductor amplifying element used in a microwave amplifier has a gain having a frequency characteristic of −6 dB/oct, and its input and output impedances are very high. The cut-off frequency characteristic of a semiconductor amplifying element has been improved and the wide frequency band has been widened in the course of development of semiconductor techniques. Therefore, to obtain a new microwave amplifier, impedance matching must be performed between the signal source and the microwave amplifier, and between the microwave amplifier and the circuit of the next stage, in order to reduce unnecessary reflection of microwave power and to obtain optimum microwave characteristics.

Impedance matching methods can be roughly divided into two categories.

According to the first method, a lossless network, using lossless elements such as a capacitor, an inductor, or a line and a stub formed on a dielectric substrate, is used.

According to the second method, a loss-including network, having a combination of a resistor and a lossless element, is used.

The second method is not used in a general application, except for special cases, since the gain of the amplifier is decreased due to loss. Consequently, the first method is used more often. A lossless network uses elements such as a capacitor and an inductor for frequencies up to the UHF band. However, as the frequency is increased, smaller values of capacitance and inductance are required with higher precision, and it is sometimes difficult to obtain the required characteristics, using elements such as a capacitor and an inductor. For this reason, in a circuit processing microwave signals, a matching circuit utilizing a microstrip line formed on a dielectric is employed.

More specifically, an impedance at an input/output terminal of a microwave amplifier generally has a value unrelated to frequency, i.e., characteristic impedance Zo in the frequency band used, e.g., 50 Ω. Since the input/output impedance of the microwave amplifying element (FET element) is high, it must be matched with characteristic impedance Zo. A matching circuit for this purpose consists of a transmission line and an open or short line. The transmission line has a specific line length and a self characteristic impedance, and can change the impedance and the phase with respect to a load impedance. The transmission line and the open or short line can change the admittance.

In the conventional microwave amplifier, when impedance matching is performed in the frequency band used, power is not reflected and the gain is increased. Since the reflected power is increased outside the frequency band used, the gain is decreased.

On the other hand, however, since the input- and output-matching circuits approach a matched state not only in the frequency band used (4-GHz band) but also at a specific frequency (7-GHz band) higher than this, the gain of the microwave amplifier is increased. In other words, in some cases the gain is great at frequencies higher than the 7-GHz band outside the 4-GHz band.

Stability factor K and the stability of a microwave amplifier have the following relationship. When stability factor K is 1 or more, the microwave amplifier is stable, regardless of its input/output load impedance. Otherwise, the microwave amplifier becomes unstable or oscillates, depending on the impedance of the input-/output load.

With the conventional microwave amplifier described above, stability factor K becomes less than 1 in a 12-GHz band, and the microwave amplifier oscillates or operates unstably, depending on the input/output load impedance due to the influence of a reflected component. For example, assume that another circuit is connected to this microwave amplifier. When the power source is turned on, a noise reflection phenomenon occurs thereupon, and self oscillation can occur in the 12-GHz band. Therefore, when the conventional microwave amplifier using a lossless matching circuit is designed, not only the frequency band used, but also the maximum oscillation frequency and the load condition of its semiconductor amplifying element must be considered.

SUMMARY OF THE INVENTION

The present invention has been made in view of the above situation, and has as its object to provide a matching circuit for a microwave device, having improved microwave characteristics in order to obtain a stable operation with a simple arrangement.

It is another object of the present invention to provide a matching circuit for a microwave device which can be easily designed by improving the microwave characteristics.

It is still another object of the present invention to provide a matching circuit for a microwave device wherein a mixer can use a wide frequency band.

In order to achieve the above objects, the present invention provides a matching circuit for a microwave device, which is formed on a dielectric substrate, comprising: a main line formed between a high frequency (RF) signal input terminal and an input terminal of a semiconductor element; a stub, formed close to the main line, for obtaining matching of the high frequency input terminal with the semiconductor element; and a variable impedance circuit including at least a capacitor connected between said main line and said stub, the capacitor exhibiting a high resistance with respect to unnecessary components at both the main line and the semiconductor element output, thus attenuating the unnecessary components.

BRIEF DESCRIPTION OF THE INVENTION

DETAILED DESCRIPTION OF THE PREFERRED EMBODIMENTS

Figure 1:
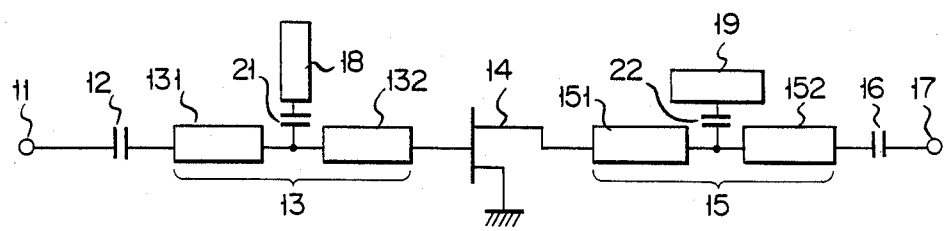
FIG. 1 is a circuit diagram showing an embodiment of the present invention.
Figure 2:
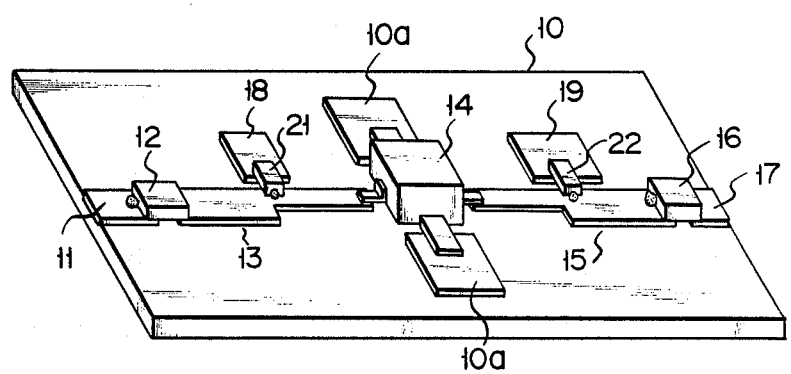
FIG. 2 is a perspective view showing a parts mount state of the circuit shown in FIG. 1.

FIG. 1 is a circuit diagram of an embodiment of the present invention, and FIG. 2 shows its parts mount state. A high frequency (RF) input signal is supplied to input terminal 11 and is input to semiconductor amplifying element 14 via DC cut capacitor 12 and main line 13. Amplifying element 14 is a field effect transistor (FET). The output of element 14 is supplied to output terminal 17 via main line 15 and DC cut capacitor 16. In the present invention, the connection of line 13 with stub 18, and of line 15 with stub 19 is different from the conventional case. More specifically, capacitor 21 is connected between line 13 and stub 18, and capacitor 22 is connected between line 15 and stub 19. These capacitors 21 and 22, respectively, constitute circuits whose impedances vary in accordance with frequency.

Semiconductor amplifying element 14 is used as a source ground. The source of element 14 is connected directly to an earth pattern formed on dielectric substrate 10, and its gate and drain are connected to input- and output-matching circuits, respectively.

Figure 3:
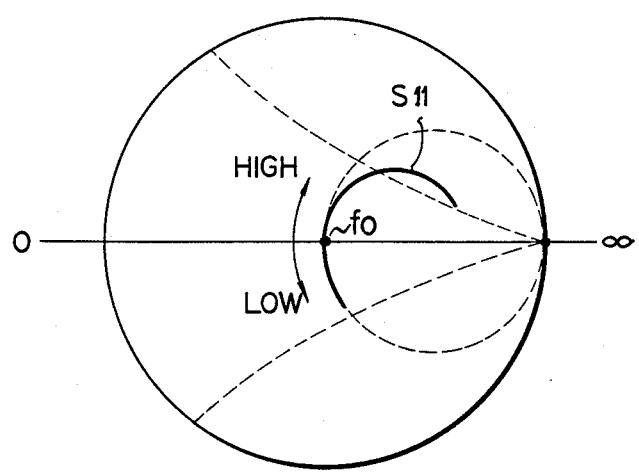
FIG. 3 is a view for explaining the characteristics of a capacitor used in the present invention.

In the above circuit, capacitors 21 and 22 have such capacitance that their self impedances are substantially 0 in the frequency band used, (4-GHz band). FIG. 3 is a Smith chart showing the frequency characteristics of S11 when the impedances of capacitors 21 and 22 are shown, using S parameters. When an input signal frequency is lower than center frequency f0 (4 GHz, in this case), the capacitance component of the capacitor appears as the capacitor characteristics. However, as the input signal frequency is increased, the inductance and resistance components of the capacitor are increased and appear as the major component of the capacitor characteristics.

Therefore, with the above arrangement, the following effects are obtained:

(1) In the frequency band used, the impedances of capacitors 21 and 22 become 0 and open stub 18 and 19 operate in a normal manner. In other words, impedance matching between the input-matching circuit and semiconductor amplifying element 14, and between amplifying element 14 and the output-matching circuit, can be obtained without loss.

(2) As the frequency is increased, the inductance and resistance components of capacitors 21 and 22 are increased. Impedance matching involves a network including a loss, and power which has been reflected is absorbed. Therefore, due to this loss, factors causing instability or oscillation can be suppressed, thereby stabilizing the amplifier operation.

Figure 4:
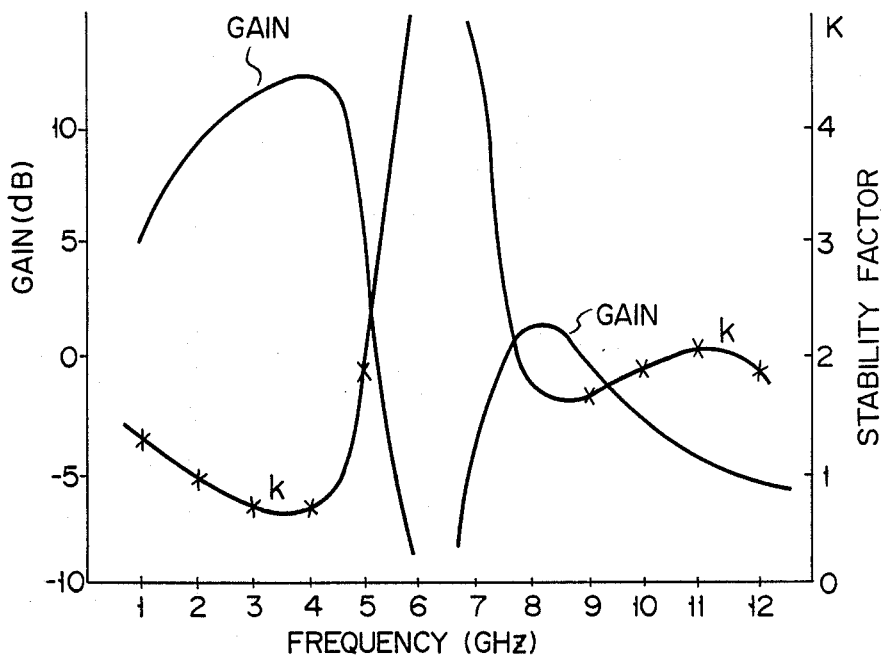
FIG. 4 is a graph showing the frequency dependencies of the power gain and a stability factor of the circuit shown in FIG. 1.

FIG. 4 shows the frequency response of the power gain and stability factor K of the microwave amplifier described above. As is apparent from these frequency responses, stability factor K is as large as about 1.8 in the vicinity of 12 GHz, which is not used in practice, compared to the conventional factor K of 0.9. With this factor K (1.8), the stability of the amplifier becomes considerably high, even considering the variations in the microwave characteristics of semiconductor amplifying element 14 and variations due to temperature change. In the above embodiment, capacitors 21 and 22 are connected between open stub 18 and main line 13, and between open stub 19 and main line 15, respectively. However, a capacitor can be provided between a short stub and a main line.

In the above embodiment, the design values of the respective elements and lines are as follows.

The capacitance of capacitor 12 is 4 pF. The impedance and line length of line section 131 in main line 13 are 75 Ω and 0.14 λ, respectively. The impedance and line length of line section 132 in line 13 are 120 Ω and 0.1 λ, respectively. The capacitance of capacitor 21 is 4 pF. The impedance and line length of stub 18 are 10 Ω and 0.03 λ, respectively. The impedance and line length of line section 151 in main line 15 are 120 Ω and 0.13 λ, respectively. The impedance and line length of line section 152 in line 15 are 58 Ω and 0.03 λ, respectively. The capacitance of capacitor 22 is 4 pF. The impedance and line length of stub 19 are 28 Ω and 0.02 λ, respectively. The capacitance of capacitor 16 is 4 pF.

Note that λ denotes the wavelength in the frequency used (4 GHz), and is 75 mm.

As described above, according to the present invention, the stability of a microwave amplifier outside the frequency band used is improved with a very simple configuration, thus providing an inexpensive matching circuit for a microwave device which can be produced on a mass production line.

Figure 5:
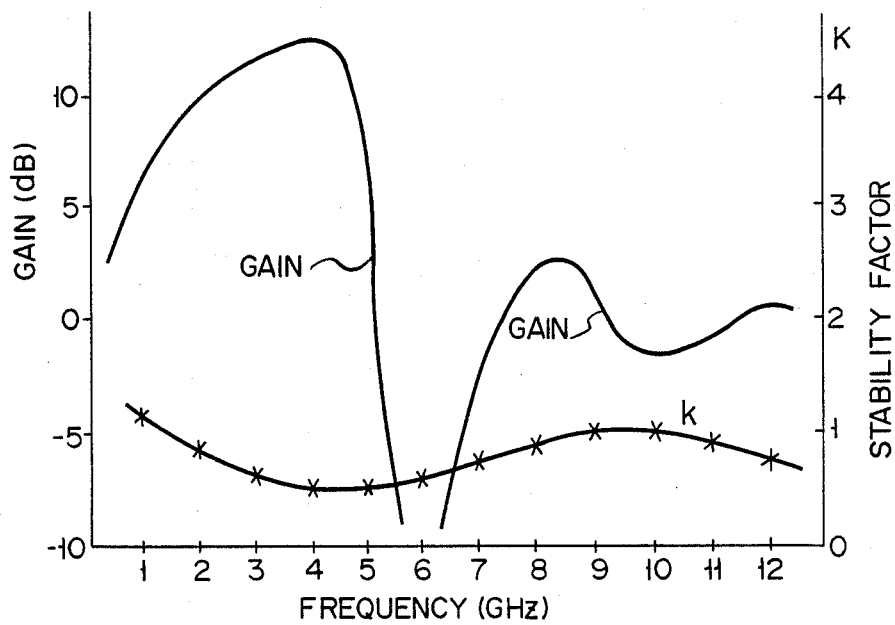
FIG. 5 is a graph showing the frequency dependencies of the power gain and a stability factor of a conventional microwave amplifier.

FIG. 5 shows the frequency response of a conventional microwave amplifier. Unlike the present invention, the conventional microwave amplifier does not have a capacitor between its stub and line. Therefore, the stability factor k in the 6–8-GHz and 12-GHz bands is less than 1. When the impedance of a microwave amplifier is matched in the frequency band used, power is not reflected and the gain of the microwave amplifier is high. Since there is no reflected component, even when the stability factor k is less than 1, the microwave amplifier operates stably. Outside the frequency band used, however, since the power reflection is considerable, the gain becomes low. When the stability factor k of the amplifier in this frequency band is less than 1, the operation of the microwave amplifier becomes unstable due to the influence of the reflected component.

On the other hand, since the input- and output-matching circuits approach a matched state not only in the frequency band used (4-GHz band), but also in a specific frequency (7-GHz band) higher than this, the combined gain of the semiconductor amplifying element and the matching circuits is increased to a certain value, even in this frequency band (7-GHz band). In other words, as shown in FIG. 5, the gain of the microwave amplifier is increased to a certain degree, even in the 7-GHz band, which is outside the 4-GHz band.

Therefore, according to the conventional microwave amplifier, since stability factor K becomes less than 1 in a 12-GHz band or 6–8-GHz band, oscillation or unstable operation occurs due to the influence of the reflected component depending on the conditions of the input-/output load impedance of the microwave amplifier.

According to the present invention, however, since the stability factor k outside the frequency band used is set to be 1 or more, as described before, the stability is increased.

In the above embodiment, the characteristics of capacitors 21 and 22 are utilized so that a loss occurs in the matching circuits mainly in a frequency band higher than the frequency used. However, a factor causing instability can be removed also in a frequency band lower than the frequency used.

Figure 6:
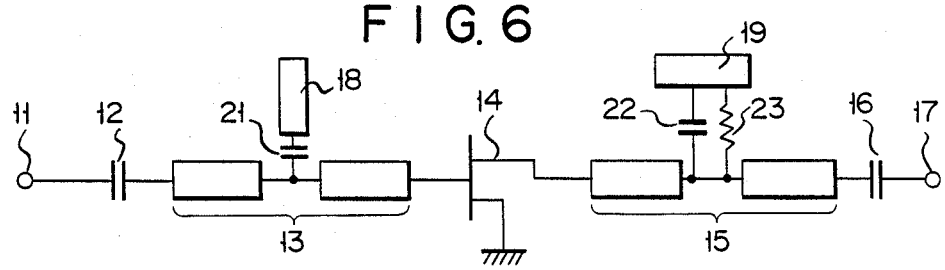
FIG. 6 is a circuit diagram showing another embodiment of the present invention.
Figure 7:
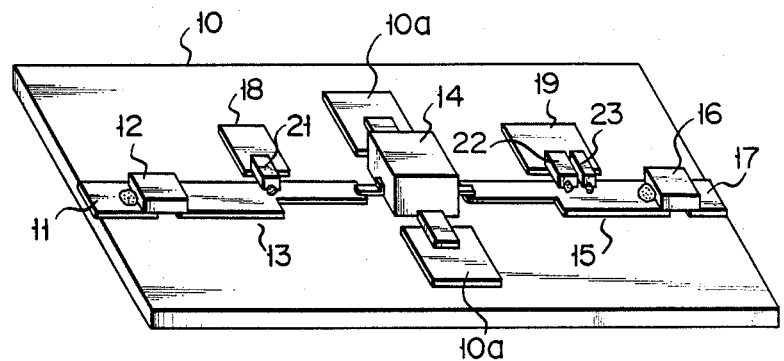
FIG. 7 is a perspective view showing a parts mount state of the circuit shown in FIG. 6.

More specifically, as is apparent from the characteristics of the conventional microwave amplifier shown in FIG. 5, the stability factor k of the amplifier is less than 1, even in a frequency band lower than the frequency band used (4-GHz band). When the stability factor k is less than 1, the microwave amplifier can operate unstably depending on the load conditions. FIGS. 6 and 7 show an embodiment wherein such unstable operation is prevented.

Figure 8:
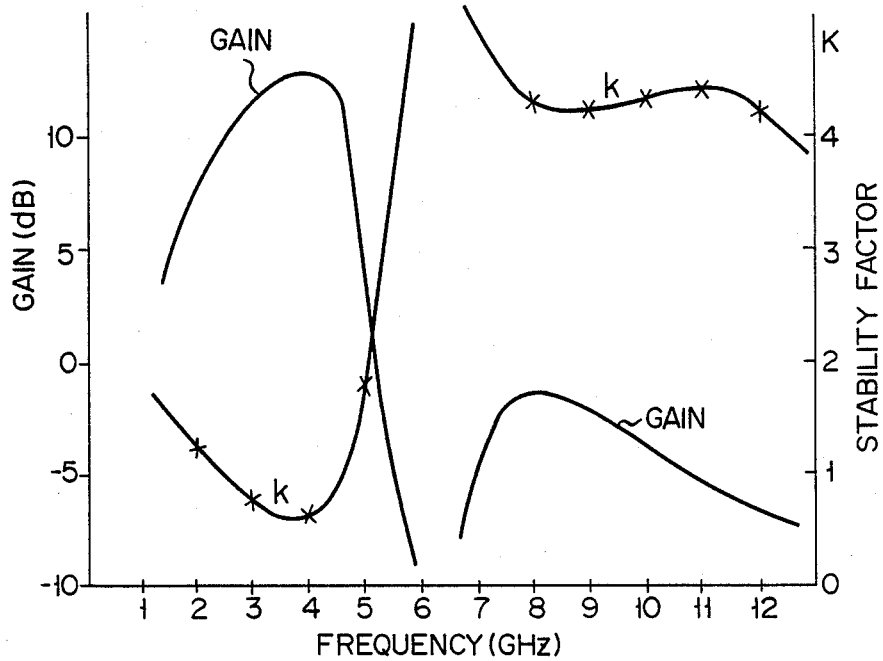
FIG. 8 is a graph showing the frequency response of the circuit shown in FIG. 6.

FIG. 6 is a circuit diagram of this embodiment, FIG. 7 shows the parts mount state thereof, and FIG. 8 shows the microwave characteristics of a microwave amplifier of this embodiment. The same reference numerals as in FIG. 1 denote the same parts in these figures.

In this embodiment, resistor 23 is connected in parallel with capacitor 22. The resistance of resistor 23 is, e.g., 33 Ω. Except for this, the circuit arrangement of FIG. 6 is the same as the embodiment of FIG. 1, and the design values of the respective circuit components are the same as those in FIG. 1. In this embodiment, in addition to effects (1) and (2) of the embodiment described above, the following effect is obtained:

(3) When an input signal frequency becomes lower than the frequency used, the influence of resistor 23 with respect to the signal is increased, since the impedance of capacitor 22 is increased. Therefore, even when the input signal frequency becomes lower than the frequency used, the matching circuits include resistance components to serve as circuits for causing loss of the signal, and stabilize the microwave amplifier in the same manner as in a case when the frequency is increased.

FIG. 8 shows the frequency characteristics of the microwave amplifier of this embodiment. As is apparent from FIG. 8, the stability factor k is improved to 1 or more, compared to the conventional 0.9 in the vicinity of 2 GHz, and improved to about 4.0, compared to the conventional 2.0 in the vicinity of 8 GHz.

Thus, even when a signal having a frequency higher or lower than the frequency band used is supplied, a stable operation can be performed.

In the above embodiment, a microwave amplifier having a function to attenuate unnecessary power was described. The present invention can effectively provide the same effect when it is applied to a microwave mixer.

Figure 9:
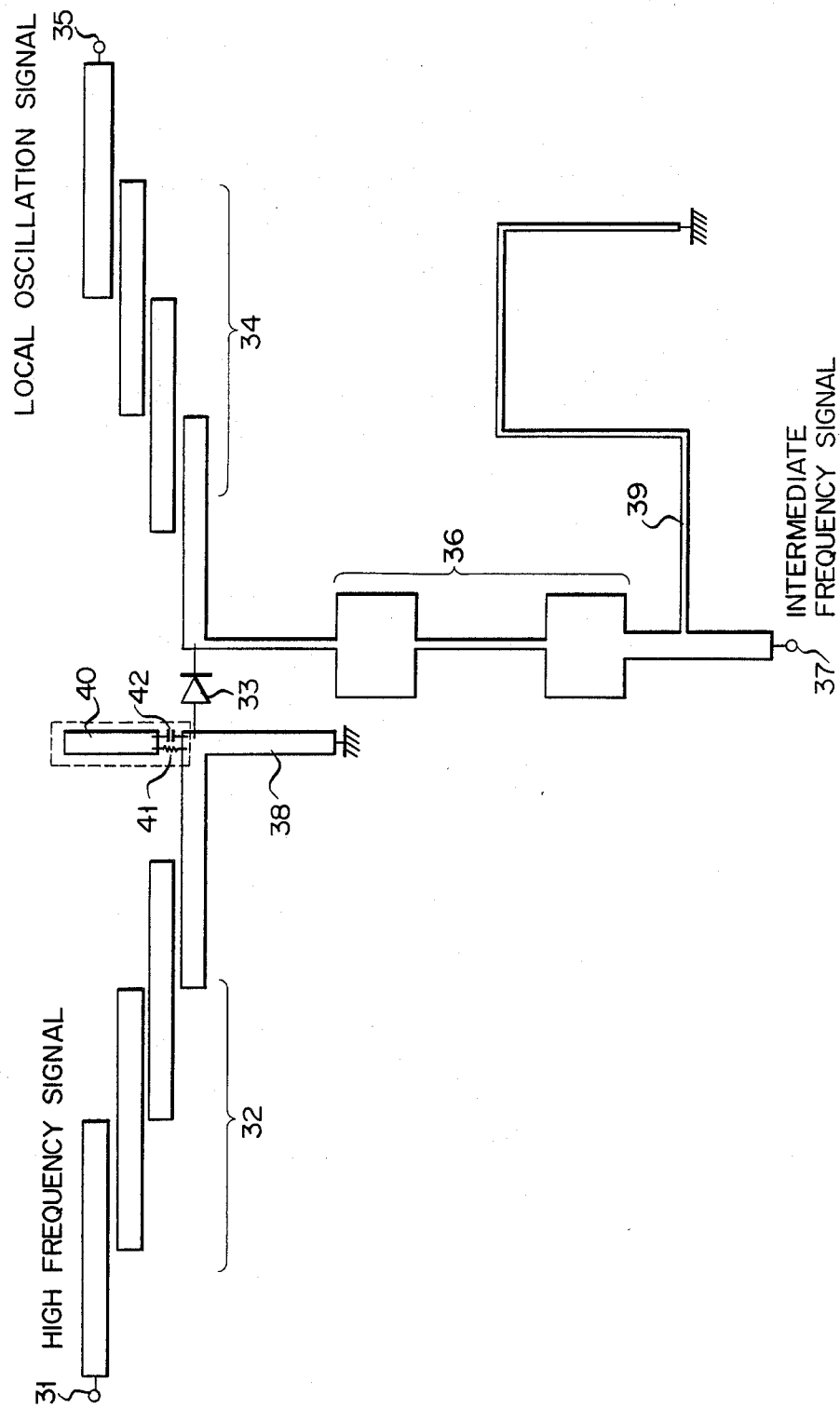
FIG. 9 is a circuit diagram showing another embodiment (mixer) of the present invention.

FIG. 9 shows an embodiment wherein the present invention is applied to a microwave mixer.

A high-frequency input signal is supplied to input terminal 31. Terminal 31 is connected to the input line of band-pass filter 32. The output line of filter 32 is connected to the anode of mixer diode 33. The cathode of diode 33 is connected to one line of band-pass filter 34 for introducing a local oscillation signal. Terminal 35 of the other line of filter 34 receives the local oscillation signal. The cathode of diode 33 is connected to intermediate-frequency signal output terminal 37 via low-pass filter 36.

In the mixer having this arrangement, line sections 38 and 39 constitute a feedback path for routing a rectifying current to mixer diode 33. Open stub 40, arranged near the anode of diode 33, prevents the local oscillation signal supplied from terminal 35 from leaking to the high-frequency signal input terminal 31. Therefore, stub 40 has a line length ¼ wavelength λ of the local oscillation signal.

A parallel circuit of resistor 41 and capacitor 42 is connected between stub 40 and line section 38. Capacitor 42 has characteristics sufficient for passing the local oscillation signal of the frequency used and a high-frequency signal, and has an impedance comparatively high with respect to a low-frequency (intermediate-frequency) signal.

Figure 10:
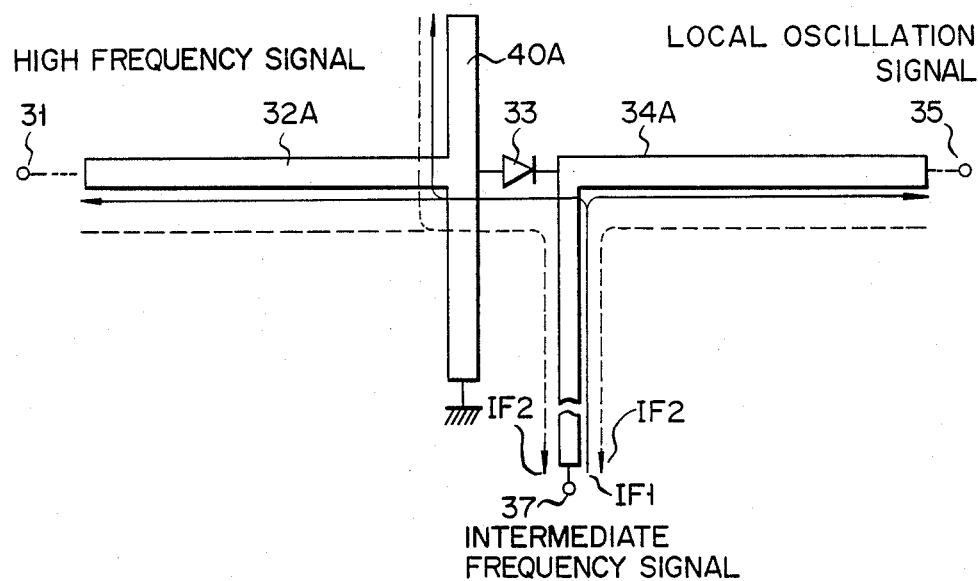
FIG. 10 is a circuit diagram for explaining the operation of the mixer shown in FIG. 9.
Figure 11:
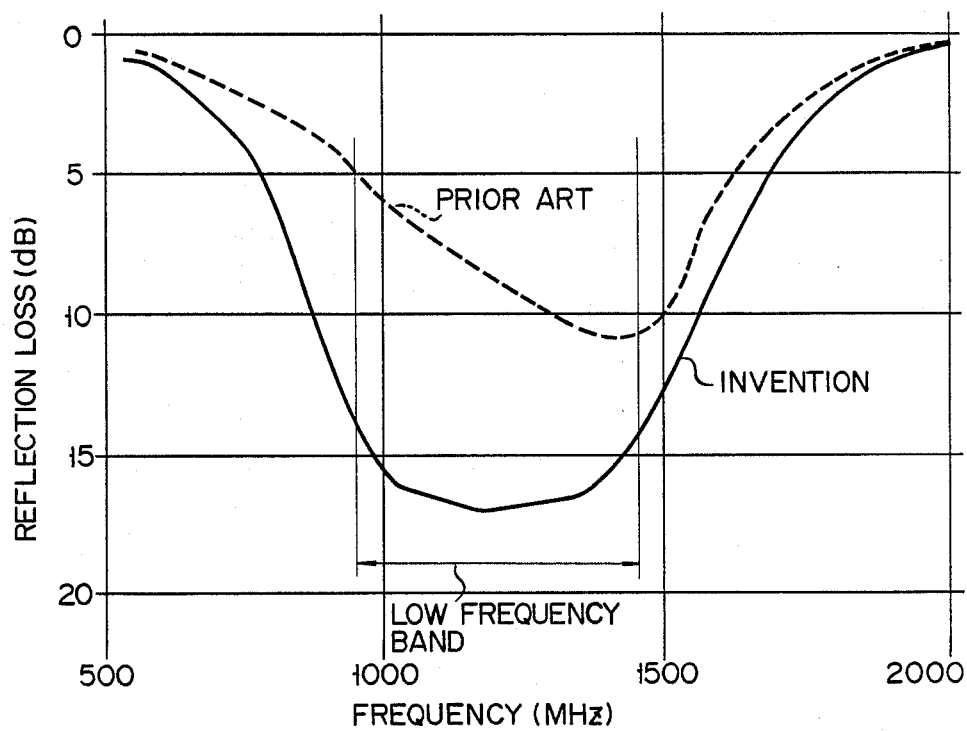
FIG. 11 is a graph showing the frequency response of the reflection loss at an intermediate-frequency signal output terminal of a mixer shown in FIG. 9, and those of a conventional mixer, in comparison with each other.

The matching circuit of the above microwave mixer, i.e., a section consisting of stub 40, resistor 41, and capacitor 42, does not cause any loss in a signal of the frequency used, and causes a loss in an unnecessary reflected wave, i.e., the reflected component of the intermediate-frequency. As a result, a good intermediate-frequency signal appears at terminal 37. FIGS. 10 and 11 are views for explaining the operation of such a microwave mixer. Let us consider a mixer as shown in FIG. 10, i.e., a mixer to which the present invention is not applied. Assume that high-frequency and local oscillation signals are supplied to terminals 31 and 35, respectively, and intermediate-frequency signal IF1 can be obtained at terminal 37.

Intermediate signal IF1, which is obtained by mixing the high-frequency and local oscillation signals by mixer diode 33, appears at terminal 37. However, part of signal IF1 reaches the free ends of open stubs 32A, 34A, and 40A, as indicated by the solid lines, are reflected at the respective open ends, and return to terminal 37, as indicated by broken lines. This component corresponds to reflected component IF2.

In the conventional microwave mixer to which the present invention is not applied, the reflection loss in the intermediate-frequency signal at terminal 37 has characteristics as indicated by the characteristic curve of the broken line in FIG. 11. In contrast to this, according to the microwave mixer to which the present invention is applied, the reflection loss in the intermediate-frequency signal has the characteristics as indicated by the characteristic curve of the solid line in FIG. 11. More specifically, the reflected component of the intermediate-frequency signal is attenuated by capacitor 42 and resistor 41, which are provided in accordance with the present invention, and the reflected wave returning to terminal 37 is greatly attenuated. On the other hand, the local oscillation signal can be prevented from leaking to input terminal 31 by open stub 40. Despite the insertion of resistor 41 and capacitor 42, other characteristics remain uninfluenced, such as matching the high-frequency input terminal 31 with mixer diode 33, and frequency conversion loss.

Figure 12:
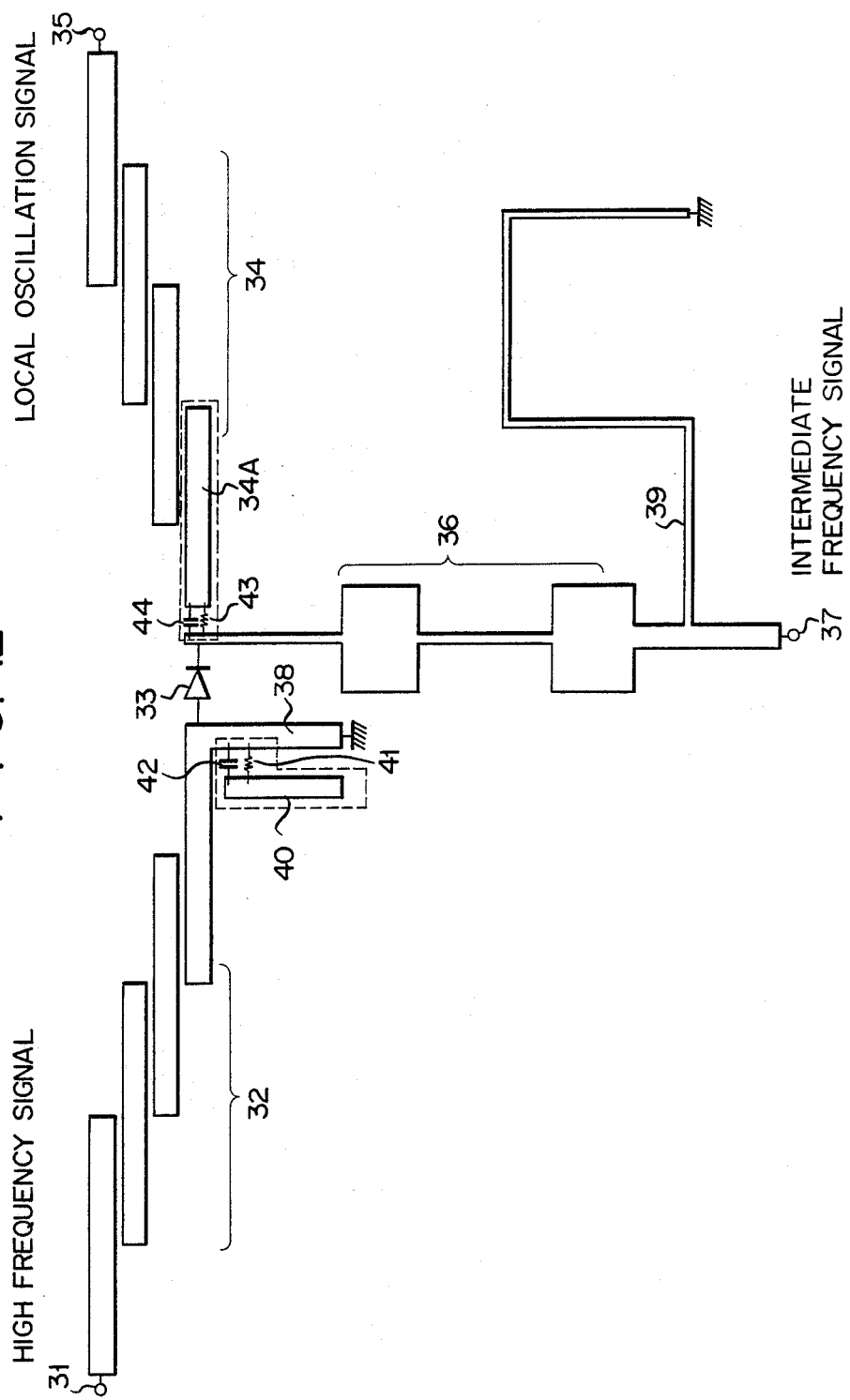
FIG. 12 is a circuit diagram of still another embodiment of the present invention.

FIG. 12 shows a microwave mixer according to still another embodiment of the present invention. In FIG. 12, the same reference numerals as in FIG. 9 denote the same circuit portions. In FIG. 12, a parallel circuit of resistor 43 and capacitor 44 is connected between the cathode of mixer diode 33 and line section 34A of band-pass filter 34. Due to the presence of this parallel circuit, a loss in the reflected wave (low frequency wave) can be obtained. Namely, the capacitance of capacitor 44 is selected to provide no loss in a local oscillation signal and a large loss in an intermediate-frequency signal. Accordingly, the intermediate-frequency signal at terminal 37 contains no reflected waves. The line as open stub 40 can be arranged as shown in FIG. 12, other than as in the embodiment of FIG. 9. Furthermore, when stub 40 is arranged as shown in FIG. 12, the connecting area of components, such as resistor 41 and capacitor 42, is not increased along line 32A, and the matching characteristics of band-pass filter 32 with mixer diode 33 are further stabilized.

As described above, when the present invention is applied to a microwave mixer, low-frequency (intermediate-frequency) signal output terminal 37 can have excellent matching performance with a mixer in a wide band with a simple configuration. Since the matching circuit of the present invention does not influence other characteristics, a capacitor for providing an automatic variable-impedance characteristic can be easily connected after the circuit design is determined. Furthermore, since the matching circuit has a simple configuration, the entire device can be made small and inexpensive. In the conventional mixer, since a signal at an output terminal has a frequency considerably lower than another frequency used, that is a local RF (radio frequency), mismatching often occurs. This leads to mismatching with the circuit of the next stage over a broad band, resulting in a ripple. According to the present invention, however, such an inconvenience can be avoided.

What is claimed is:

1. A matching circuit, for a microwave device, which is formed on a dielectric substrate and comprising:
   a main line formed between a high-frequency signal input terminal and an input terminal of a semiconductor element for transmitting a high frequency signal;
   a stub, formed close to said main line, for obtaining matching of said high-frequency input terminal with said semiconductor element; and
   a variable-impedance circuit, including at least a capacitor having one end connected to a portion of said main line and the other end connected to said stub, said capacitor exhibiting a high resistance with respect to unnecessary components at both said main line and the output of said semiconductor element, thus attenuating the unnecessary components.

2. A matching circuit according to claim 1, wherein said variable-impedance circuit comprises a resistor connected in parallel with said capacitor.

3. A matching circuit, for a microwave device, which is arranged on a dielectric substrate and comprising:
   a high-frequency signal-guiding main line for guiding a high-frequency signal to one end of a mixer diode;
   a local oscillation signal-guiding main line for guiding a local oscillation signal to the other end of said mixer diode;
   a low-pass filter line, connected to said other end of said mixer diode, and constituting a low-pass filter for outputting an intermediate-frequency signal;
   a stub, formed close to said high-frequency signal-guiding main line, for decreasing leakage of the local oscillation signal to the high freuqency input; and
   a capacitor, having one end, connected to a portion of said high-frequency signal-guiding main line and the other end connected to said stub, for absorbing a reflected component of the intermediate frequency signal.

4. A matching circuit according to claim 3, wherein a capacitor for absorbing a reflected component of the intermediate-frequency signal is connected also between said local oscillation signal-guiding main line and said mixer diode.

5. A matching circuit, for a microwave device, which is formed on a dielectric substrate and comprising:
   a first main line connected between a signal input terminal and an input terminal of a semiconductor amplifying element;
   a first stub formed close to said first main line;
   a first variable-impedance circuit including at least a capacitor having one end connected to a portion of said first main line and the other end connected to said first stub, and having a low impedance with respect to a signal of a frequency band used and a high impedance, which provides a loss, with respect to a signal of a higher frequency band than the frequency band used;
   a second main line connected between an output terminal of said semiconductor amplifying element and a signal output terminal;
   a second stub formed close to said second main line; and
   a second variable-impedance circuit including at least one capacitor having one end connected to a portion of said second main line and the other end connected to said second stub, and having a low impedance with respect to the signal of the frequency band used and a high impedance, which provides a loss, with respect to a signal of a higher frequency band than the frequency band used.

* * * * *